Feb. 10, 1970 L. F. MILLER 3,495,133

CIRCUIT STRUCTURE INCLUDING SEMICONDUCTIVE CHIP DEVICES JOINED TO A SUBSTRATE BY SOLDER CONTACTS

Original Filed June 18, 1965 2 Sheets-Sheet 1

INVENTOR.
LEWIS F. MILLER
BY Joseph L. Spiegel
ATTORNEY

United States Patent Office 3,495,133
Patented Feb. 10, 1970

3,495,133
CIRCUIT STRUCTURE INCLUDING SEMICONDUCTIVE CHIP DEVICES JOINED TO A SUBSTRATE BY SOLDER CONTACTS

Lewis F. Miller, La Grangeville, N.Y., assignor to International Business Machines Corporation, Armonk, N.Y., a corporation of New York Original application June 18, 1965, Ser. No. 465,034. Divided and this application Feb. 27, 1968, Ser. No. 708,631
Int. Cl. H02b *1/04*
U.S. Cl. 317—101 18 Claims

ABSTRACT OF THE DISCLOSURE

A microminiature circuit structure includes a dielectric substrate having a plurality of wettable by solder connecting areas. The regions immediately surrounding the connecting areas are not wettable by solder. A microminiature component is joined to these connecting areas by means of its solder contacts, being otherwise spaced from the substrate.

CROSS-REFERENCE TO RELATED APPLICATION

This application is a divisional application of Ser. No. 465,034, filed June 18, 1965, now Patent No. 3,429,040.

BACKGROUND OF THE INVENTION

This invention relates to positioning microminiature components in electrical contact with and otherwise spaced from a supporting dielectric substrate and, in particular, to the resulting microminiature circuit structure.

Integrated circuit devices, whether individual active devices, individual passive devices, multiple active devices within a single chip, or multiple passive and active devices within a single chip, require suitable input/output connections between themselves and other circuit elements or structures. These devices are typically very small, for example in the order of square mils, and fragile. Because of their size and fragility they are commonly carried on substrates for support. Interconnection of these devices to the substrate is a particular problem. A number of interconnection requirements must be fulfilled before the resultant connection is acceptable. Thermal bonding processes which are widely employed to make electrical contact to semiconductor devices fail to meet one or more of these criteria. One criterion is that the interconnection must have sufficient strength to withstand normal shock and vibration associated with information handling systems. Another criterion is that the connecting material must not deteriorate or change electrical or mechanical characteristics when tested under extreme humidity or temperature conditions. Additionally, the interconnection must not short circuit the semiconductor. The interconnection should also have a melting point sufficiently high that it will not be effected during any soldering of the substrate to a supporting card. Finally, the connecting material should not produce a doping action on the active and passive chip devices with which the substrate is associated.

The use of a ductile solder pad to support chip devices has been proposed to reduce the transmission of thermal or mechanical stresses to the joint between the pad and the chip device. The ductile pad structure has proven unworkable until the present time because there was no apparent way of preventing the collapse of the pad structure during the heat-joining step and the resulting touching of the chip device to the supporting substrate. The touching of the chip device to the conductive electrodes directly causes electrical shorts and thereby the failure of the circuit structure.

It is the object of this invention, therefore, to provide a microminiature circuit structure that utilizes only solder to make electrical contact with and space the microminiature components from the supporting dielectric substrate.

SUMMARY OF THE INVENTION

These and other objects are accomplished according to the broad aspects of the present invention by providing a circuit structure in which surface tension is used to support a microminiature component during joining to a supporting structure. The dielectric supporting substrate is provided with an electrically conductive pattern having a plurality of connecting areas. The connecting areas are wettable with solder. The areas immediately surrounding the connecting areas, however, are not wettable by solder. A coating of solder is then applied to the size-limited connecting areas. A microminiature component which has solder contacts extending therefrom is then positioned on the preselected solder connecting areas. The component contacts are gently pushed onto the solder to hold the component temporarily in place. The substrate holding the microminiature component is then heated to a temperature at which the solder melts. The molten solder is maintained in substantially a ball shape because the areas immediately adjacent to the connecting areas are not wettable by the solder. The solder connection is then allowed to cool and the microminiature component is thereby electrically connected to the conductive pattern on the dielectric substrate and spaced from the substrate.

It has been observed that components thus positioned on the substrate that are misaligned when initially positioned on the solder coated connecting areas, are self-aligned when the solder is softened during the joining step. This advantage is also attributed to surface tension. The self-alignment feature greatly decreases the chances of inferior connections automatically and without an additional production step. Further, it can relax the stringent positioning requirements.

BRIEF DESCRIPTION OF THE DRAWING

The foregoing and other objects, features and advantages of the invention will be apparent from the following more particular description of the preferred embodiments of the invention as illustrated in the accompanying drawings.

DESCRIPTION OF THE PREFERRED EMBODIMENTS

The microminiature components to be attached to the substrate may be active devices, passive devices or any combination of passive and active devices within a single chip. The only necessary requirement for the device is that it require electrical connection to a dielectric substrate.

Figures 1, 5:
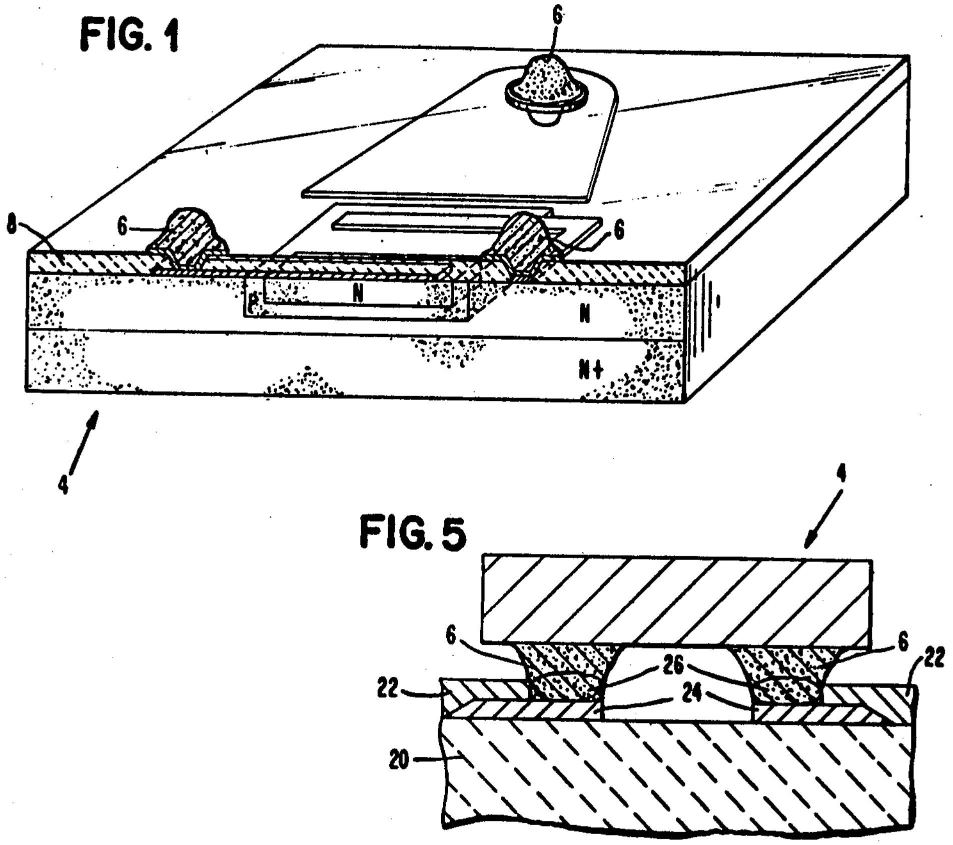
FIGURE 1 is a cutaway perspective view of a microminiature chip component to be fastened to a supporting substrate.
FIGURE 5 illustrates the microminiature circuit structure obtained from using the method of FIGURE 4.

One active chip device which is usable is described in the article "Solid Logic Technology: Versatile, High-Performance Microelectronics" by E. M. Davis, W. E. Harding, R. S. Schwartz and J. J. Corning, published in the IBM Journal 1964. This active chip device will be hereinafter used for purpose of explanation of the present invention. The active chip component 4 shown in FIGURE 1 is a glass hermetically sealed component having solder ball contacts 6. Typically, the chip component is of the order of 25 mils by 25 mils square. The solder balls 6 are attached to the active semiconductor device through openings in the glass layer 8 covering the device. Before positioning the solder balls in the glass layer openings, a conductive metal film is deposited in the opening. The film has good adhesion to the glass underlying metal strips which connect to the semiconductor chip electrodes. After positioning the balls 6 in the opening the component is heated to join the balls and the metal film thereby establishing good electrical mechanical connection between the solder balls and the electrodes.

There are three basic embodiments in which microminiature components are positioned in electrical contact with and otherwise spaced from a supporting dielectric substrate. The dielectric substrate can be composed of any of the common dielectric materials such as ceramics, glasses and plastics that can withstand the application of the conductive pattern thereto and the heat required in the solder joining step. Each of the methods has in common the fact that a connecting area is fabricated that is wettable with solder while the area immediately surrounding the connecting area is not wettable with solder. In this manner the spacing of the microminiature component from the substrate is effected.

Figures 2A, 2B, 2C, 3, 6A, 6B, 6C, 7:
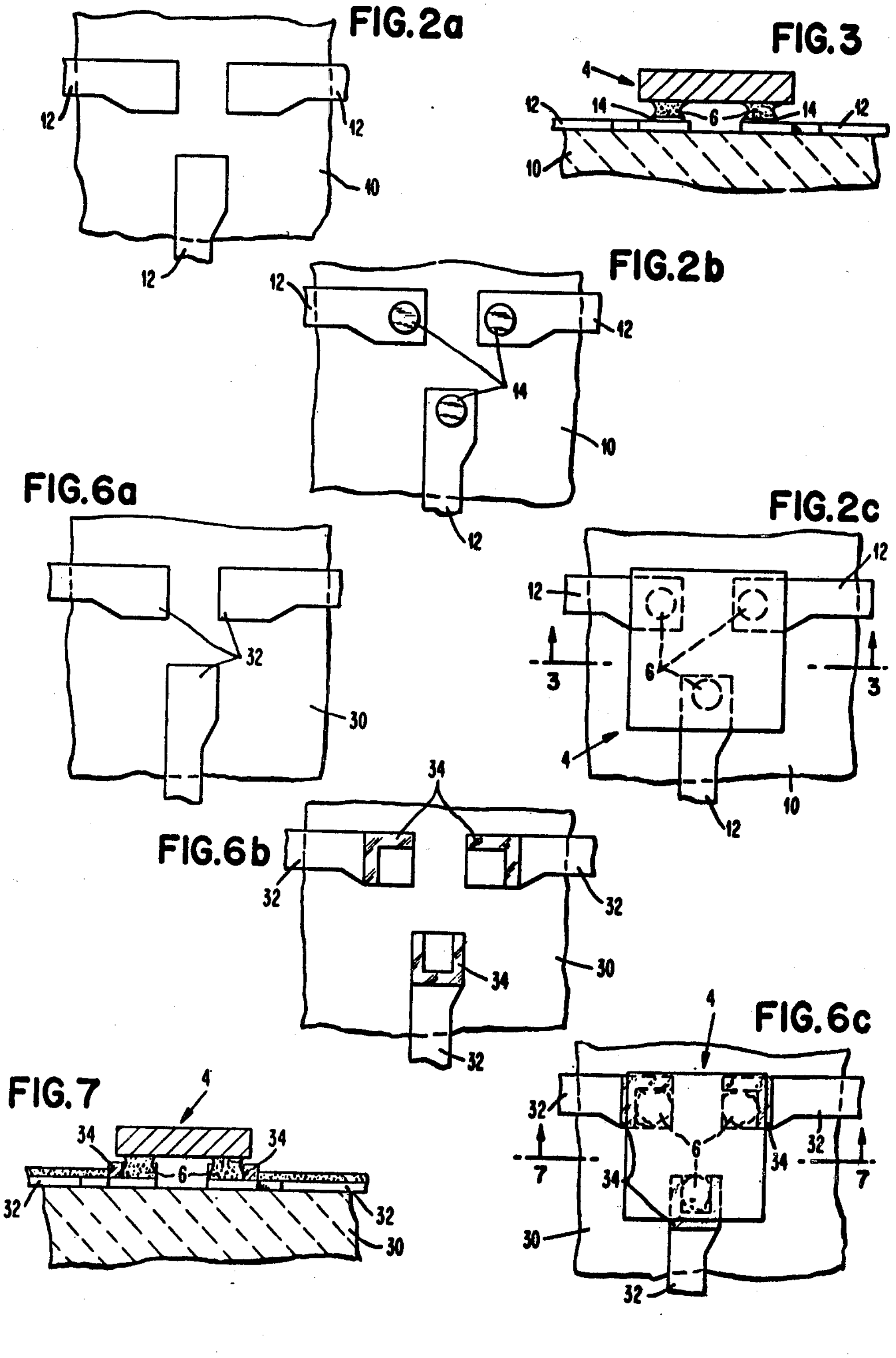
FIGURE 2*a*, *b* and *c* illustrate a first method embodiment for positioning microminiature components on a supporting dielectric substrate.
FIGURE 3 illustrates the microminiature circuit structure obtained from utilizing the method of FIGURES 2*a*, *b* and *c*.
FIGURES 6*a*, *b* and *c* illustrate a third method embodiment for positioning microminiature components on a supporting substrate.
FIGURE 7 illustrates the microminiature circuit structure obtained from the use of the FIGURE 6 method.

Reference is now made to FIGURES 2 *a*, *b* and *c* and FIGURE 3, disclosing the first embodiment. An electrically conductive pattern 12 is applied to a dielectric substrate 10 and is subsequently dried and fired if required. The electrically conductive pattern is not wettable with solder. In FIGURE 2*b* a wettable with solder conducting connecting areas in the form of dots 14 are applied to the conductive pattern by conventional printing techniques, such as silk screening. The dots are dried and fired, if required, at suitable temperatures. Solder is then applied to the connecting area. The solder application may be, for example, by dipping into a solder bath. The solder adheres to the connecting area dots 14 and not at all to the remaining portions of the conductive pattern. Rosin or other applicable flux is applied in solution to the soldered areas by conventional techniques, such as brushing, spraying or dipping. A microminiature component, such as the three ball active chip device 4 having the three solder balls 6 connected thereto is gently pushed into the flux covering the solder connecting areas 14 of the conductive pattern. The substrate 10 having the microminiature component chip temporarily attached to it is passed into an oven where the solder contacts and the connecting areas are heated to a temperature and for a time sufficient to soften the solder. The solder ball on the chip and the solder from the connecting area form a unified solder mass at this temperature. The solder maintains itself in substantially a ball on the dots 14 because of surface tension phenomena caused by the fact that the solder does not wet the conductive pattern 12. The component is thereby supported by the molten solder ball and spaced from the dielectric substrate 10. The temperature is reduced to room temperature and the solder solidifies. The resulting electrically connecting device is illustrated in FIGURE 3.

Figure 4:
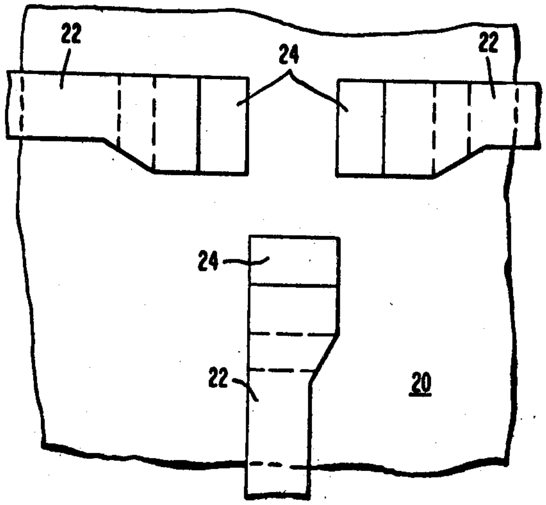
FIGURE 4 illustrates a second method embodiment for positioning microminiature components on a substrate.

Referring now to FIGURES 4 and 5 there is shown a second embodiment of the present invention. The second embodiment is similar to that of the first method, however, rather than having solder wettable dots applied to the conductive pattern not wettable with solder, solder wettable connecting areas 24 are applied to the substrate 20 itself which are contiguous with the conductive pattern 22. The areas 24 are then dried and fired if required. Solder is then applied to the connecting areas 24 to form a coating 26. A solder flux is applied over the solder. A microminiature chip component 4 is positioned into the solder flux and the solder is softened in the heating oven as was described in the first embodiment. The solder is then cooled to produce the microminiature circuit structure of FIGURE 5.

A third embodiment is illustrated in FIGURES 6*a*, *b* and *c* and FIGURE 7 wherein a wettable with solder electrically conductive pattern having a plurality of connecting areas is screened on a supporting dielectric substrate 30. The pattern 32 is dried and fired if required. A pattern 34 of material is applied to the conductive pattern 32 that is not wettable with solder to make the areas immediately surrounding the connecting area not wettable with solder. This material does not have to be conductive and can be, for example, a glass frit, or a polymeric material or not wettable with solder metal. The material can be printed by any conventional technique in the desired pattern, dried and fired if necessary to produce a continuous coating that is not wettable with solder. A coating of solder is then applied to the solder wettable areas such as by dipping the substrate into a solder bath. A flux is applied over the solder. A microminiature component 4 having solder contacts 6 extending therefrom is positioned on a connecting area of the conductive pattern 32. The substrate, chip component and the connecting solder are heated in a manner as described in the other embodiments and the solder is subsequently cooled to provide the microminiature circuit structure of FIGURE 7.

The conductive materials used in the embodiments are of two types, that is, one that is wettable with solder and the other that is not wettable with solder. A common requirement for both types is high conductivity because the printed conductors typically have a width of 5 to 15 mils or less and a thickness of 0.5 to 1.5 mils. The conductors are, therefore, preferably largely composed of single or combinations of noble metals such as gold, silver, platinum and palladium. One useful solder wettable conductive material is an alloy of silver and palladium such as described in the copending U.S. patent application Ser. No. 370,467 filed May 27, 1964 of Lewis F. Miller entitled "Conductive Element and Method" and assigned to the same assignee as of the present invention, now U.S. Patent No. 3,374,110 issued Mar. 19, 1968. The silver-palladium alloy has mixed with it small quantities of vitreous frit which acts to bond the metals to the substrate and to themselves. Another class of very useful conductive material is alloys of gold and platinum. There are, however, many other solder wettable conductive materials that can be successfully used. Useful non-wettable with solder conductive materials are disclosed in the copending U.S. patent application Ser. No. 465,035 filed June 18, 1965 of Lewis F. Miller and Richard Spielberger entitled "Conductive Element" and assigned to the same assignee as the present invention, now U.S. Patent No. 3,401,126 issued Sept. 10, 1968. This solder nonwettable conductive material is composed of highly conductive noble metals or alloys having dispersed therein minor quantities of metal oxides having a melting point over 1000° C. and the characteristic of destroying the solder wettability of the metal without otherwise materially altering its properties. Another class of non-wettable with solder conductive materials is noble metal dispersions in a polymeric binder material.

A wide range of solders can be used as the ductile electrical connection and microminiature support. These solders include all binary alloys of lead and tin as well as other low melting alloys which may be combinations of indium, gallium, silver, gold, antimony, etc. However, the preferred solder composition is between about 5 to 40 percent by weight tin and 95 to 60 percent by weight lead. The softening temperature of this preferred solder composition is about 300° C. The solder joining of microminiature chip to the substrate for this preferred solder is between approximately 330° C. to 365° C.

The invention has been described with reference to a three contact active device. However, it will be understood by those skilled in the art that the invention is not so limited and other active, passive and combinations of active and passive devices having any number of solder contacts can be joined to a substrate in the manner described. Also, while the contacts are illustrated spherical in shape, it is obvious that other contact shapes are usable.

While the invention has been particularly shown and described with reference to the preferred embodiments thereof, it will be understood by those skilled in the art that various changes in form and detail may be made therein without departing from the spirit and scope of the invention.

What is claimed is:

1. A microminiature circuit structure comprising:
a dielectric substrate having a conductive electrode pattern thereon;
said conductive pattern having a plurality of connecting areas;
the areas immediately surounding said connecting areas being composed of a material which is not wetted by solder;
a chip of semiconductive material having a planar face with solder wettable terminal areas;
solder contacts bonding said terminal areas to said connecting areas; and
said chip being otherwise spaced and physically supported from said substrate solely by means of said solder contacts at said connecting areas.

2. A microminiature circuit structure comprising:
a dielectric substrate having a conductive electrode pattern thereon which is composed of a material which is not wettable with solder;
said conductive pattern having a plurality of connecting areas;
a small, wettable with solder, conductive film at each of said plurality of connecting areas;
a chip of semiconductive material having a planar face with solder wettable terminal areas;
solder contacts bonding said terminal areas to said connecting areas; and
said chip being otherwise spaced and physically supported from said substrate solely by means of said solder contacts at said preselected connecting areas.

3. The circuit structure of claim 2 wherein the said small, wettable with solder, conductive film is located over said conductive pattern at said connecting areas.

4. The circuit structure of claim 2 wherein the said small, wettable with solder conductive film is located on said substrate and contiguous with the said conductive pattern.

5. A microminiature circuit structure comprising:
a dielectric substrate having a conductive electrode pattern thereon which is composed of a material which is wettable with solder;
said conductive pattern having a plurality of connecting areas;
a pattern of a material which is not wetted by solder over said conductive pattern which isolates a small wettable with solder area at each of the said connecting areas from the remaining portions of said conductive pattern;
a chip of semiconductive material having a planar face with solder wettable terminal areas;
solder contacts bonding said terminal areas to said connecting areas; and
said chip being otherwise spaced and physically supported from said substrate solely by means of said solder at said preselected connecting areas.

6. A microminiature circuit structure comprising:
an insulating substrate having a surface;
connecting areas at the surface which are wettable by solder;
regions surrounding the connecting areas not wettable by solder;
a chip of semiconductive material having a planar face with solder wettable terminal areas;
solder contacts bonding said terminal areas to said connecting areas; and
said chip being otherwise spaced and physically supported from said substrate solely by means of said solder contacts at said connecting areas.

7. The invention defined by claim 6 wherein the chip includes an active device.

8. The invention defined by claim 6 wherein the chip includes a passive device.

9. The invention defined by claim 6 wherein the chip includes a combination of active and passive devices.

10. The invention defined by claim 6 wherein
the not wettable by solder regions include a pattern of conductive material not wettable by solder on the surface of the subtrate, in electrical contact with the connecting areas.

11. The invention defined by claim 10 wherein the not wettable pattern and connecting areas are contiguous.

12. The invention defined by claim 10 wherein the connecting areas are formed on the non-wettable pattern.

13. A microminiature circuit structure comprising:
a substrate having a plurality of connecting areas which are wettable by solder;
regions surrounding said connecting areas not wettable by solder;
a chip of semiconductive material having a planar face with solder wettable terminal areas; and
solder contacts establishing a unified joint between the terminal areas of said chip and said connecting areas, said solder contacts forming the sole means spacing and physically supporting said chip from said substrate.

14. The invention defined by claim 13 wherein said chip includes an active device.

15. The invention defined by claim 13 wherein said chip includes a passive device.

16. The invention defined by claim 13 wherein said chip includes a combination of active and passive devices.

17. A microminiature circuit structure comprising:
a dielectric substrate having a conductive electrode pattern thereon which is composed of a material which is wettable with solder;
said conductive pattern having a plurality of connecting areas;
a pattern of a material which is not wetted by solder over said conductive pattern which isolates a small, wettable with solder area at each of the said connecting areas from the remaining portions of said conductive pattern, said pattern of material which is not wetted by solder being a fused glass frit; and,
a microminiature component fused to preselected said connecting areas with solder;
said component being otherwise spaced and physically supported from said substrate by means of said solder at said preselected connecting areas.

18. A microminiature circuit structure comprising:
a dielectric substrate having a conductive electrode pattern thereon which is composed of a material which is wettable with solder;
said conductive pattern having a plurality of connecting areas;
a pattern of a material which is not wetted by solder over said conductive pattern which isolates a small, wettable with solder area at each of the said connecting areas from the remaining portions of said conductive pattern, said pattern of material which is not wetted by solder being a fused conductive coating; and, a microminiature component fused to preselected said connecting areas with solder;

said component being otherwise spaced and physically supported from said substrate by means of said solder at said preselected connecting areas.

References Cited

UNITED STATES PATENTS

| | | |
|---|---|---|
| 3,280,019 | 10/1966 | Harding et al. |
| 3,302,067 | 1/1967 | Jackson et al. |
| 3,316,458 | 4/1967 | Jenny. |

DARRELL L. CLAY, Primary Examiner

U.S. Cl. X.R.

174—68.5; 317—234